(12) United States Patent
Matsumoto et al.

(10) Patent No.: US 9,293,216 B2
(45) Date of Patent: Mar. 22, 2016

(54) SEMICONDUCTOR DEVICE AND METHOD OF SEARCHING FOR ERASURE COUNT IN SEMICONDUCTOR MEMORY

(71) Applicant: LAPIS Semiconductor Co., Ltd., Yokohama (JP)

(72) Inventors: Takuya Matsumoto, Yokohama (JP); Satoshi Miyazaki, Yokohama (JP); Tomoyuki Maeda, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/483,272

(22) Filed: Sep. 11, 2014

(65) Prior Publication Data

US 2015/0092492 A1   Apr. 2, 2015

(30) Foreign Application Priority Data

Sep. 30, 2013   (JP) .................... 2013-205003

(51) Int. Cl.
| | | |
|---|---|---|
| *G11C 16/14* | (2006.01) | |
| *G11C 16/04* | (2006.01) | |
| *G11C 16/34* | (2006.01) | |
| *G11C 16/16* | (2006.01) | |
| *G11C 7/10* | (2006.01) | |
| *G11C 11/4093* | (2006.01) | |
| *G11C 16/08* | (2006.01) | |
| *G06F 3/06* | (2006.01) | |
| *G06F 12/02* | (2006.01) | |
| *G06F 11/10* | (2006.01) | |
| *G11C 11/56* | (2006.01) | |

(52) U.S. Cl.
CPC .............. *G11C 16/3431* (2013.01); *G06F 3/06* (2013.01); *G06F 11/1068* (2013.01); *G06F 12/0246* (2013.01); *G11C 16/08* (2013.01); *G11C 16/14* (2013.01); *G11C 16/3495* (2013.01); *G06F 2212/7211* (2013.01); *G11C 7/106* (2013.01); *G11C 7/1057* (2013.01); *G11C 11/5635* (2013.01); *G11C 16/0483* (2013.01); *G11C 16/16* (2013.01); *G11C 16/349* (2013.01)

(58) Field of Classification Search
CPC .... G11C 16/14; G11C 16/0483; G11C 16/16; G11C 11/5635; G11C 7/106; G11C 7/1057; G11C 16/349; G11C 16/3495
USPC ........................................ 365/185.29, 185.33
See application file for complete search history.

(56) References Cited

U.S. PATENT DOCUMENTS

| 5,963,474 A | * | 10/1999 | Uno et al. ................. 365/185.04 |
| 2009/0198869 A1 | * | 8/2009 | Mosek .......................... 711/103 |
| 2009/0287875 A1 | * | 11/2009 | Lin ................................ 711/103 |

(Continued)

FOREIGN PATENT DOCUMENTS

JP    2008-123314 A    5/2008

*Primary Examiner* — Ly D Pham
(74) *Attorney, Agent, or Firm* — Rabin & Berdo, P.C.

(57) ABSTRACT

In response to a search start instruction, a read address signal including address sequences for blocks is generated and the read address signal is provided to a block management memory to successively read sequences of erasure count data pieces corresponding to the blocks from the block management memory. Thereafter, when the erasure count data piece read from the block management memory represents an erasure count smaller than a minimum erasure count data piece, the erasure count data piece is imported and retained and outputted as the minimum erasure count data piece. Also, the read address signal is imported and retained and an address indicated by the read address signal is outputted as a minimum erasure count address.

12 Claims, 7 Drawing Sheets

(56) References Cited

U.S. PATENT DOCUMENTS

| | | | |
|---|---|---|---|
| 2010/0077132 A1* | 3/2010 | Hung | 711/103 |
| 2010/0125694 A1* | 5/2010 | Choi | 711/1 |
| 2010/0174845 A1* | 7/2010 | Gorobets et al. | 711/103 |
| 2010/0318719 A1* | 12/2010 | Keays et al. | 711/103 |
| 2011/0107016 A1* | 5/2011 | Kim et al. | 711/103 |
| 2013/0054878 A1* | 2/2013 | Lee et al. | 711/103 |

* cited by examiner

SEMICONDUCTOR DEVICE AND METHOD OF SEARCHING FOR ERASURE COUNT IN SEMICONDUCTOR MEMORY

BACKGROUND OF THE INVENTION

1. Field of the Invention

The present invention relates to a semiconductor device, for example, a semiconductor device including a semiconductor memory, and a method of searching for a data erasure count in the semiconductor memory.

2. Description of the Related Art

A flash memory has been known as a non-volatile semiconductor memory in which data can be rewritten and no data is erased even when power is turned off. Especially in a NAND type flash memory, upon writing data, data erasure is first performed in a block unit composed of a plurality of memory cells. Due to an upper limit in the erasable number of times in each of the blocks, however, it is necessary to manage the erasure count for the blocks in the memory as needed. In view of this, a semiconductor storage equipped with: a RAM (Random Access Memory) that stores, corresponding to each of blocks in a flash memory, erasure count data representing an erasure count performed in the block; and a CPU that performs control of reading the erasure count data from the RAM and searching for a block with a minimum erasure count has been proposed (see Japanese Patent Application Laid-Open No. 2008-123314, for example). Such a CPU repeatedly provides a read instruction to the RAM to read the erasure count data for the blocks one by one and compares in size the erasure count data for the blocks. In this manner, the CPU searches for the block with the smallest erasure count as an erasure target. Therefore, the CPU repeatedly executes a series of control, composed of read control for reading the erasure count data corresponding to one block and comparison control for comparing the erasure count data, for the number of times equal to the number of all the erasure count data stored in the RAM. In order to sequentially execute these read control and comparison control by the CPU, however, a large amount of time is consumed for the search due to interventions of instruction fetch cycles for specifying such control.

SUMMARY OF THE INVENTION

It is an object of the present invention to provide a semiconductor device capable of searching for a block with a minimum erasure count at a high speed and a method of searching for an erasure count in a semiconductor memory.

A semiconductor device according to the present invention is a semiconductor device including a semiconductor memory, for performing data erasure in units of blocks. The semiconductor device includes: a semiconductor memory in which data erasure is performed in units of blocks; a block management memory that stores, corresponding to each of the blocks, an erasure count data piece representing a data erasure count performed in the block; a read address generation circuit that generates a read address signal in response to a search start instruction and provides the read address signal to the block management memory to successively read the erasure count data pieces from the block management memory; and a minimum erasure count search circuit that searches for a block corresponding to an erasure count data piece representing a minimum erasure count from among the erasure count data pieces read from the block management memory. The minimum erasure count search circuit includes: a first latch that outputs, when the erasure count data piece read from the block management memory represents an erasure count smaller than a minimum erasure count data piece, the erasure count data piece as the minimum erasure count data piece; and a second latch that outputs, when the erasure count data piece read from the block management memory represents an erasure count smaller than the minimum erasure count data piece, an address indicated by the read address signal as a minimum erasure count address.

A semiconductor device according to the present invention is a semiconductor device having a semiconductor memory in which data erasure is performed in blocks as a unit. The semiconductor device includes: a block management memory that stores, corresponding to each of the blocks, an erasure count data piece representing a data erasure count performed in the block; a read address generation circuit that generates a read address signal in response to a search start instruction and provides the read address signal to the block management memory to successively read the erasure count data pieces from the block management memory; and an erasure count search circuit that searches for a block corresponding to an erasure count data piece representing a intended erasure count from among the erasure count data pieces read from the block management memory and transmits a result of the search.

A method of searching for an erasure count in a semiconductor memory according to the present invention is a method of searching for an erasure count in a semiconductor memory in which data erasure is performed in units of blocks. The method includes: a step that stores, corresponding to each of the blocks, an erasure count data piece representing a data erasure count performed in the block in a block management memory; a step that generates a read address signal in response to a search start instruction and provides the read address signal to the block management memory to successively read the erasure count data pieces from the block management memory; and a minimum erasure count search step that searches a block corresponding to an erasure count data piece representing a minimum erasure count from among the erasure count data pieces read from the block management memory. In the minimum erasure count search step, when the erasure count data piece read from the block management memory represents an erasure count smaller than a minimum erasure count data piece, the erasure count data piece is outputted as the minimum erasure count data piece and an address indicated by the read address signal is outputted as a minimum erasure count address.

According to the present invention, a block with a minimum erasure count can be searched for in response to a search start instruction and an address of the block with the minimum erasure count can be outputted at a high speed.

DETAILED DESCRIPTION OF THE PREFERRED EMBODIMENT

An embodiment of the present invention will be described below in detail with reference to the drawings.

Figure 1:
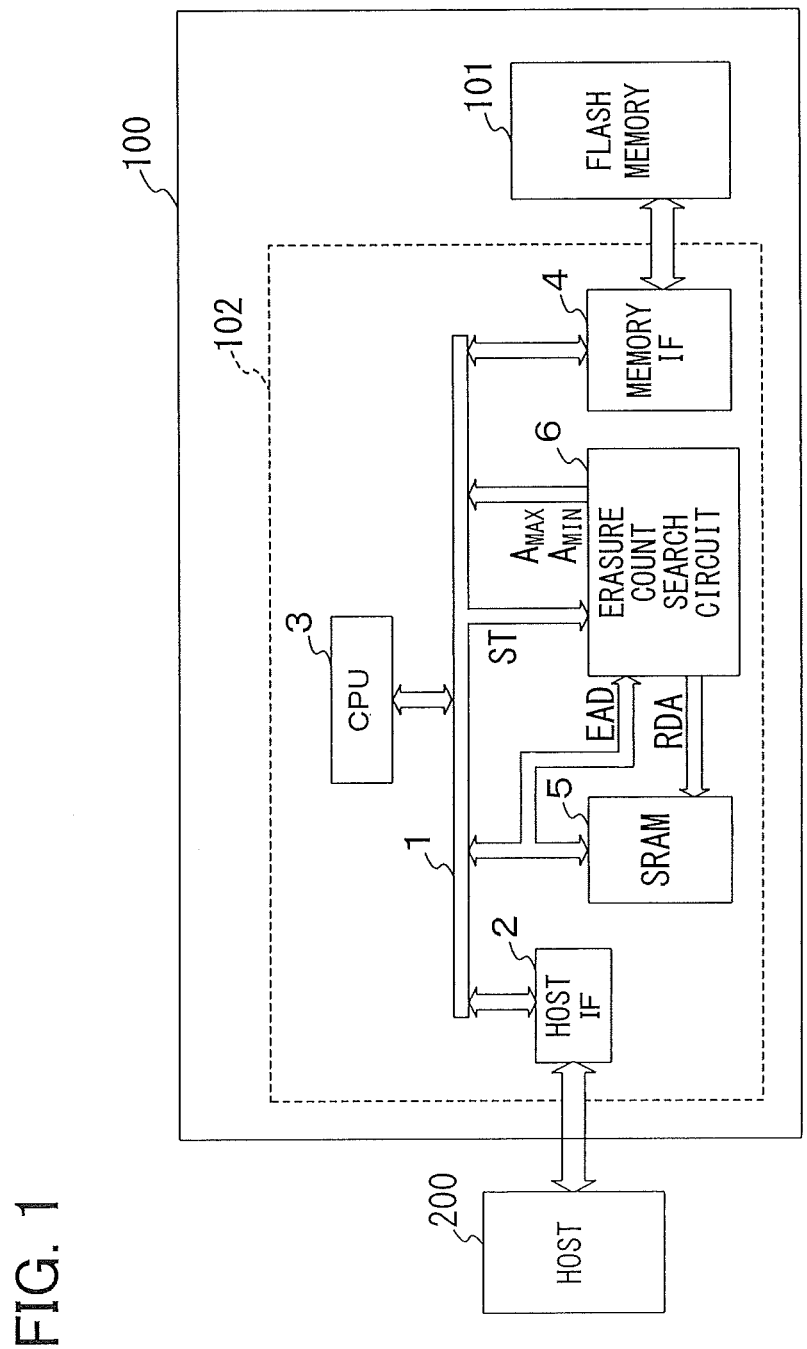
FIG. 1 is a block diagram illustrating an internal configuration of a semiconductor device 100 according to the present invention and a host device 200 connected to the semiconductor device 100.

FIG. 1 is a block diagram illustrating an internal configuration of a semiconductor device 100 of an embodiment according to the present invention and a host device 200 connected to the semiconductor device 100. The host device 200 provides a write instruction and its address data to the semiconductor device 100 in order to cause the semiconductor device 100 to store a data piece generated by execution of its main operation. The host device 200 provides a read instruction to read an intended data piece and its address data to the semiconductor device 100 so as to read and acquire the intended data piece stored in the semiconductor device 100.

As illustrated in FIG. 1, the semiconductor device 100 includes a NAND type flash memory 101, for example, as a semiconductor memory and a memory controller 102. The memory controller 102 includes a host IF (interface) part 2, a CPU (Central Processing Unit) 3, a memory IF (interface) part 4, an SRAM (Static Random Access Memory) 5 and an erasure count search circuit 6, which are all connected to a memory control bus 1.

The host IF part 2 sends, to the memory control bus 1, the address data, the data piece to be written, and the command (write instruction or read instruction) provided by the host device 200. The host IF part 2 provides the data piece read from the flash memory 101 to the host device 200 via the memory control bus 1 and the memory IF part 4.

Based on the address data and the read instruction provided by the host device 200 via the memory control bus 1, the CPU 3 provides, to the memory IF part 4, a read signal to read the intended data piece from each page of the flash memory 101 indicated by that address data.

Figure 2:
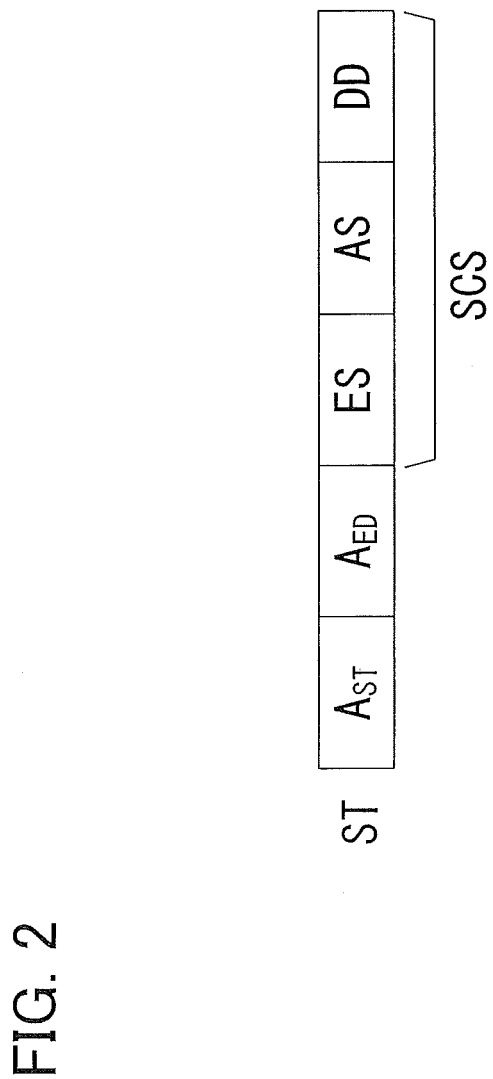
FIG. 2 is a diagram illustrating one example of a data format for search start data ST.

Based on the address data, the data piece to be written, and the write instruction provided by the host device 200 via the memory control bus 1, the CPU 3 first provides, to the erasure count search circuit 6, search start data ST including a start address $A_{ST}$, an end address $A_{ED}$, and search target setting data SCS shown in FIG. 2 in order to select a block to be a write destination. The above-described block refers to an area composed of a plurality of memory cells serving as a minimum unit when performing data erasure in the flash memory 101. According to the above-described search start data ST, the erasure count search circuit 6 searches for blocks with minimum and maximum cumulative erasure counts from among all the blocks in the flash memory 101. Then, the erasure count search circuit 6 provides, to the CPU 3, the address of the block with the minimum erasure count and the address of the block with the maximum erasure count. The CPU 3 retains these addresses for the blocks with the minimum and maximum erasure counts in an internal register (not shown). Next, the CPU 3 selects the block corresponding to the address of the minimum erasure count as a block to be the data write destination. The CPU 3 provides, to the memory IF part 4, an erasure signal to firstly perform a data erasure process on this block. Next, the CPU 3 provides, to the memory IF part 4, a write signal to write the data piece to be written corresponding to the address data in the block subjected to the data erasure process. Subsequently, the CPU 3 executes an erasure count update process for updating a cumulative erasure count for each of the blocks.

The CPU 3 also periodically performs data exchanging control on the flash memory 101 via the memory IF part 4. The data exchanging control exchanges data stored in a block with a high rewrite frequency, i.e., a block with a large cumulative erasure count and data stored in a block with a low rewrite frequency, i.e., a block with a small cumulative erasure count with each other. Specifically, due to an upper limit of the erasure count in the blocks, the block with a large erasure count reaches the upper limit of the erasure count much earlier than the block with a small erasure count, resulting in a reduced rewrite life. Therefore, in order to reduce variations in the erasure count among the blocks, the CPU 3 performs the following data exchanging control on the flash memory 101. First, the CPU 3 causes the data (referred to as first data) stored in the block with the maximum erasure count and the data (referred to as second data) stored in the block with the minimum cumulative erasure count, which have been searched for as described above, to be once written into a blank block in the flash memory 101. Next, the CPU 3 performs a data erasure process on the above-described blocks with the maximum erasure count and the minimum erasure count. Thereafter, the CPU 3 performs a write process to write the second data in the block with the maximum erasure count and write the first data in the block with the minimum erasure count. By executing such data exchanging control periodically, variations in the erasure count among the blocks can be suppressed and the rewrite life of the flash memory 101 can be therefore prolonged.

The memory IF part 4 performs, on the flash memory 101, control to read the intended data piece based on the read signal provided by the CPU 3. The memory IF part 4 then provides the data piece read from the flash memory 101 to the host IF part 2 via the memory control bus 1. Moreover, based on the erasure signal provided by the CPU 3, the memory IF part 4 performs, on the flash memory 101, control to erase data from the block indicated by this erasure signal. Furthermore, based on the write signal provided by the CPU 3, the memory IF part 4 performs, on the flash memory 101, control to write the data piece to be written.

Figure 3:
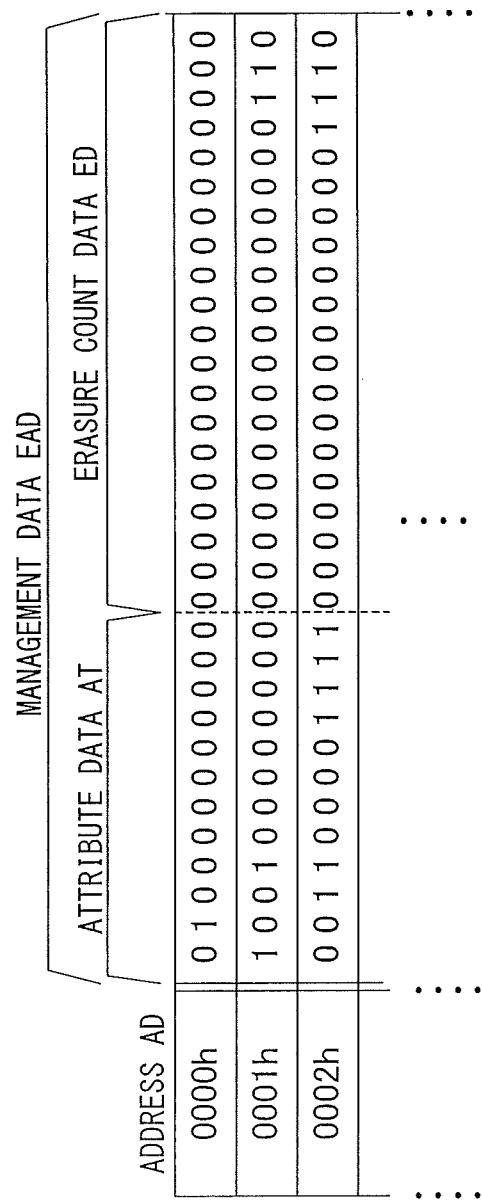
FIG. 3 is a diagram illustrating one example of management data EAD (attribute data AT and erasure count data ED) stored in an SRAM 5 corresponding to respective block addresses.
Figure 4:
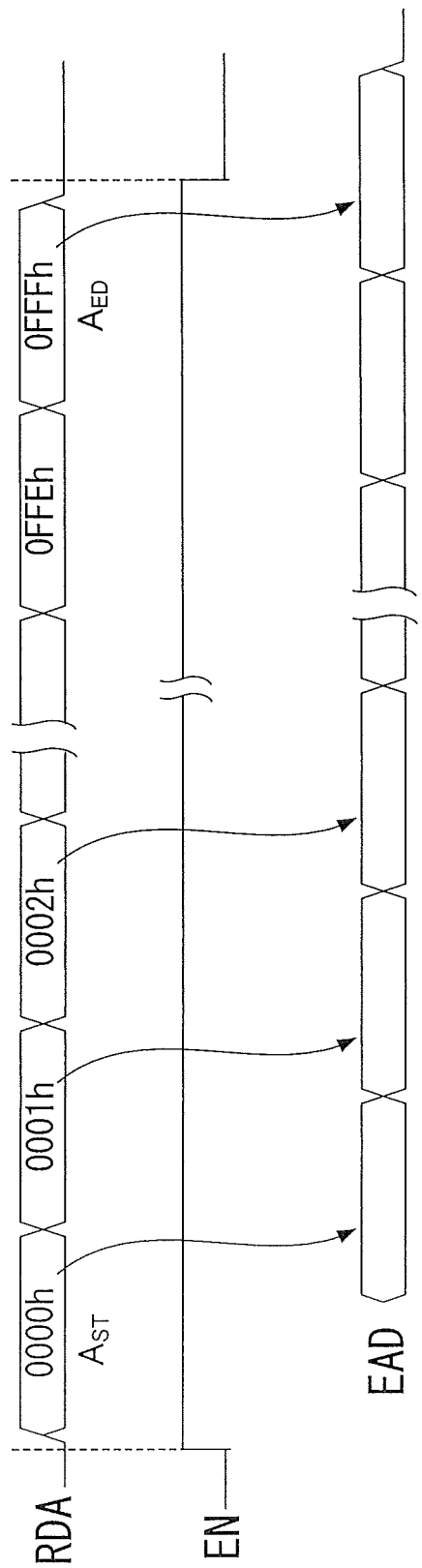
FIG. 4 is a time chart illustrating a read address signal RDA generated in a read address generation circuit 61 and sequences of the management data EAD for the respective blocks successively read from the SRAM 5 according to the read address signal RDA.

As shown in FIG. 3, corresponding to address data AD representing an address for each of the blocks in the flash memory 101, the SRAM 5 serving as a block management memory includes an area to store n-bit management data EAD for that block (n is a natural number greater than or equal to 2). The management data EAD includes: erasure count data ED representing a cumulative erasure count of data erasure performed in that block (hereinafter, referred to simply as an erasure count) in 20 bits, for example; and attribute data AT representing various attributes in that block in 12 bits, for example. Here, the erasure count data ED are all "0" at the time of product shipment. Thereafter, every time the data piece erasure as described above is performed, the CPU 3 executes the erasure count update process to increment only the erasure count data ED corresponding to the block having been an erasure target by "1." The attribute data AT, on the other hand, represents various attribute information including, for example, used information indicating whether or not data has been written into the block, destruction information indicating whether or not the block has been destroyed, and/or protected information indicating whether or not inerasable protected data such as customer data has been stored in the block. As shown in FIG. 4, based on a read address signal RDA provided by the erasure count search circuit 6, the SRAM 5 sequentially and successively reads the management data EAD for the blocks and provides sequences of such management data EAD to the erasure count search circuit 6. Note that the read address signal RDA is a signal including address data sequences assigned to the respective blocks in the flash memory 101 as shown in FIG. 4.

Figure 5:
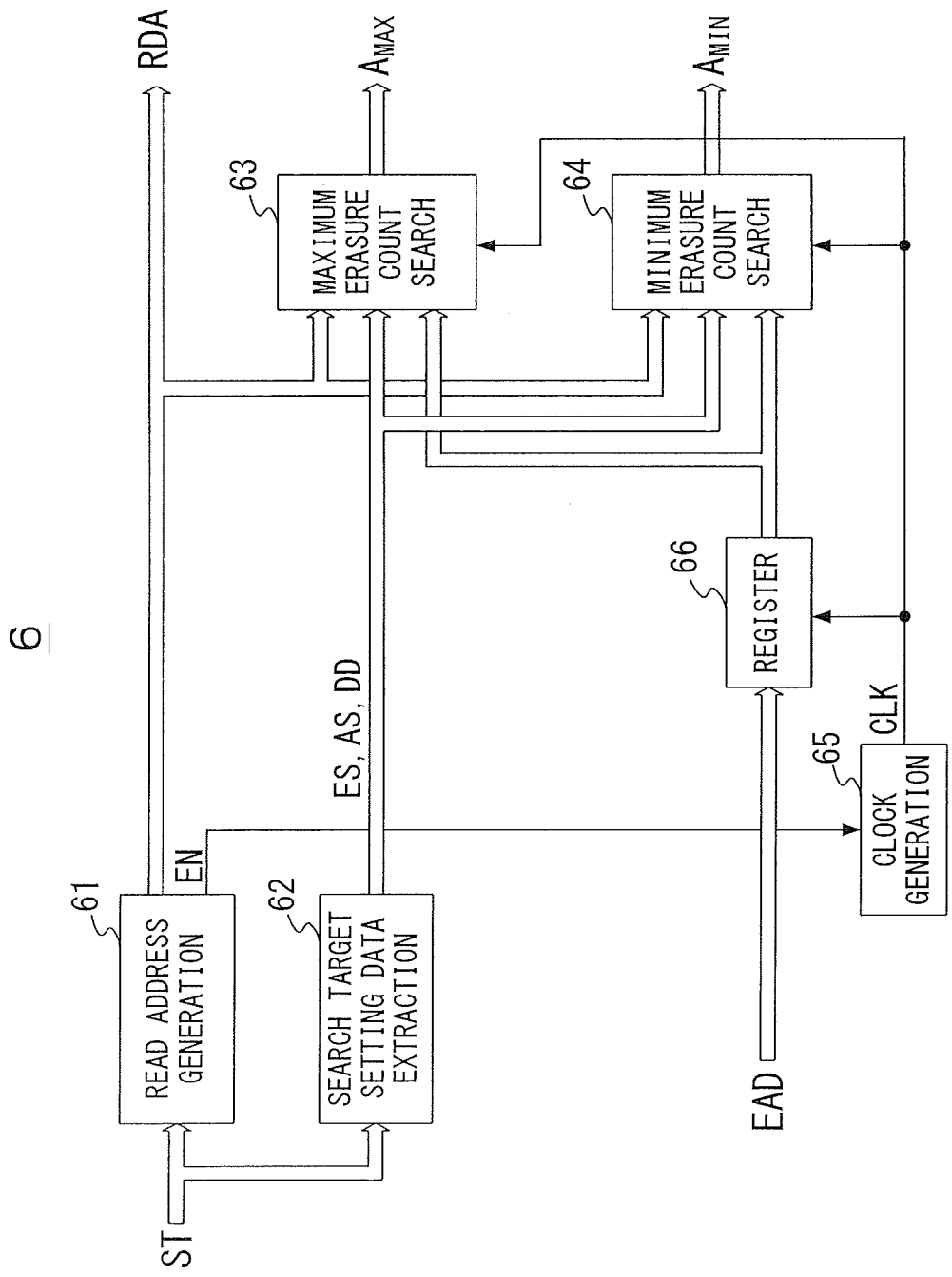
FIG. 5 is a block diagram illustrating an internal configuration of an erasure count search circuit 6.

FIG. 5 is a block diagram illustrating an internal configuration of the erasure count search circuit 6. As illustrated in FIG. 5, the erasure count search circuit 6 includes a read address generation circuit 61, a search target setting data extraction circuit 62, a maximum erasure count search part 63, a minimum erasure count search part 64, a clock generation circuit 65, and a register 66.

The read address generation circuit 61 extracts the start address $A_{ST}$ and the end address $A_{ED}$ shown in FIG. 2 from the search start data ST provided by the CPU 3. Note that the start address $A_{ST}$ is an address of the block to be the first search target among all the blocks in the flash memory 101. The end address $A_{ED}$ is an address of the block to be the last search target among all the blocks. The read address generation circuit 61 generates the read address signal RDA including address data sequences whose values are incremented by "1" from the start address $A_{ST}$ to the end address $A_{ED}$ as shown in FIG. 4. The read address generation circuit 61 then provides the read address signal RDA to each of the maximum erasure count search part 63, the minimum erasure count search part 64, and the SRAM 5. Furthermore, the read address generation circuit 61 provides, for example, an enable signal EN at a logic level 1 shown in FIG. 4 to the clock generation circuit 65 in order to set the clock generation circuit 65 in an enabled state over a period during which the read address signal RDA including the address data sequences from the start address $A_{ST}$ to the end address $A_{ED}$ is being generated.

The search target setting data extraction circuit 62 extracts the search target setting data SCS shown in FIG. 2 from the search start data ST provided by the CPU 3. The search target setting data SCS includes erasure count effective bit data ES, attribute effective bit data AS, and specified attribute data DD as shown in FIG. 2. The erasure count effective bit data ES is data for enabling only a bit group corresponding to the erasure count data ED in the management data EAD shown in FIG. 3. The erasure count effective bit data ES has a bit length same as that of the management data EAD. For example, with respect to the 32-bit management data EAD as shown in FIG. 3, the erasure count effective bit data ES is 32-bit data [000FFFFFh] in which only bit digits for 20 bits corresponding to the erasure count data ED in the management data EAD are set at the logic level 1. The attribute effective bit data AS is data for enabling only a bit group corresponding to the attribute data AT in the management data EAD shown in FIG. 3. The attribute effective bit data AS has a bit length same as that of the management data EAD. For example, with respect to the 32-bit management data EAD as shown in FIG. 3, the attribute effective bit data AS is, for example, 32-bit data [FFF00000h] in which only bit digits for 12 bits corresponding to the attribute data AT in the management data EAD are set at the logic level 1. The specified attribute data DD is used for specifying attribute contents for a block to be an erasure count search target. For example, if the attribute data AT can represent attribute items such as the above-described used information, destruction information, and protected information as attributes of a block, the specified attribute data DD specifies only an attribute required as an attribute of a block to be an erasure count search target from among these attribute items. The specified attribute data DD has a bit length same as that of the management data EAD. For example, with respect to the 32-bit management data EAD as shown in FIG. 3, the specified attribute data DD is, for example, 32-bit data [XXX00000h] for specifying attribute data for a block to be an erasure count search target by bit digits corresponding to the attribute data AT in the management data EAD. The "X" is any value from 0h to Fh.

The search target setting data extraction circuit 62 provides, to the maximum erasure count search part 63 and the minimum erasure count search part 64, the above-described erasure count effective bit data ES, attribute effective bit data AS, and specified attribute data DD collectively referred to as the search target setting data SCS extracted from the search start data ST.

The clock generation circuit 65 generates a clock signal CLK having a clock cycle same as the cycle of an address sequence in the read address signal RDA shown in FIG. 4 only over a period during which the enable signal EN shown in FIG. 4 is being provided by the read address generation circuit 61. The clock generation circuit 65 provides the clock signal CLK to the maximum erasure count search part 63, the minimum erasure count search part 64, and the register 66.

While sequentially importing and storing the sequences of the management data EAD for the respective blocks, which have been read from the SRAM 5, in synchronization with the clock signal CLK, the register 66 provides the stored management data EAD to the maximum erasure count search part 63 and the minimum erasure count search part 64.

Figure 6:
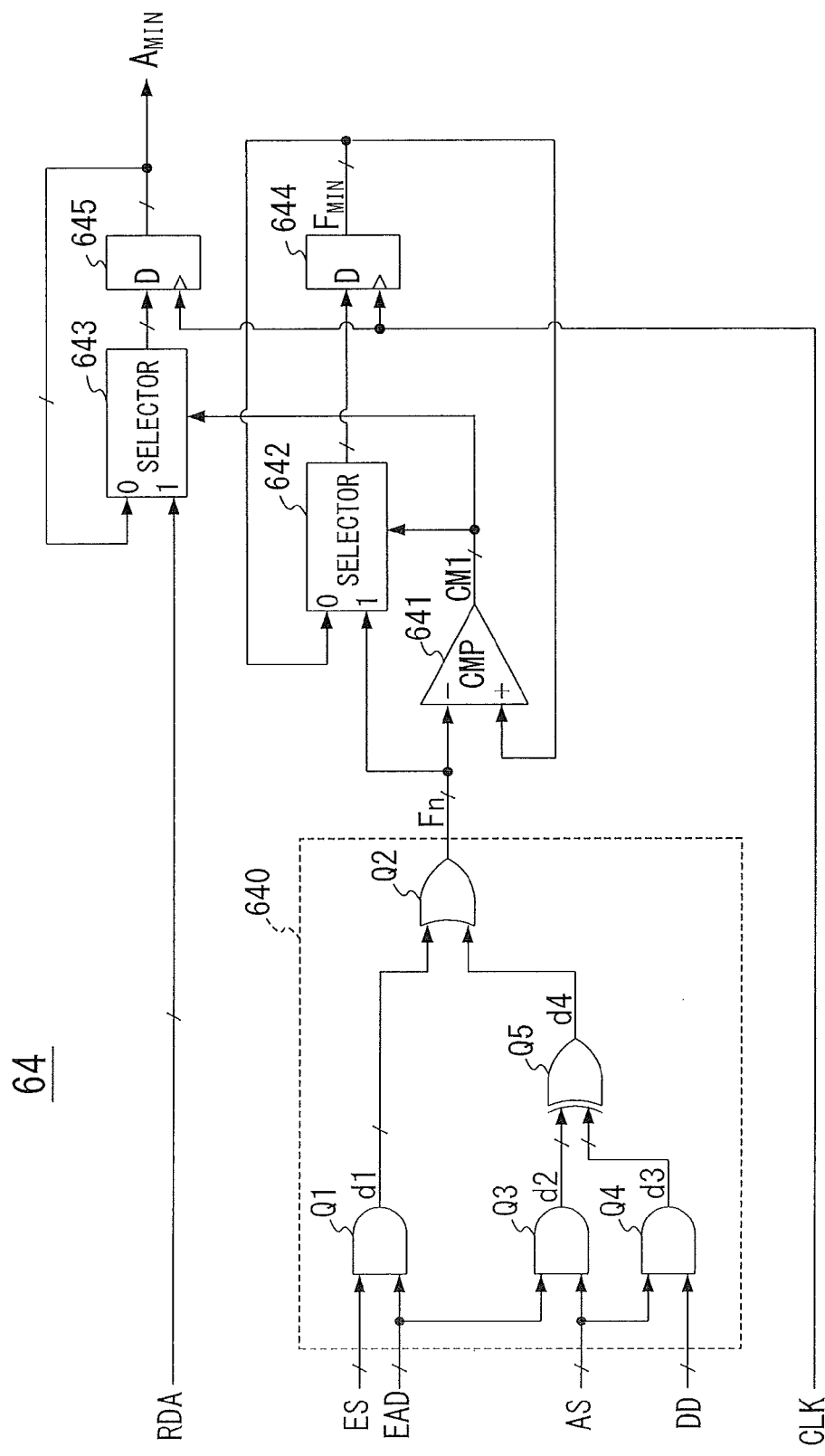
FIG. 6 is a circuit diagram illustrating an internal configuration of a minimum erasure count search part 64.

FIG. 6 is a circuit diagram illustrating an internal configuration of the minimum erasure count search part 64. As illustrated in FIG. 6, the minimum erasure count search part 64 includes a search exclusion circuit 640, a comparator 641, selectors 642 and 643, and D flip-flops (hereinafter, referred to as DFFs) 644 and 645.

The search exclusion circuit 640 includes an AND (logical product) gate group Q1, an OR (logical sum) gate group Q2, AND gate groups Q3 and Q4, and an EXOR (exclusive OR) gate Q5. The AND gate group Q1 is composed of n 2-input AND gates having the same number as the bit length of the n-bit erasure count effective bit data ES (n is a natural number greater than or equal to 2). The AND gate group Q1 obtains a logical product of the same bit digits of the erasure count effective bit data ES and the management data EAD. Accordingly, the AND gate group Q1 extracts the erasure count data ED from the management data EAD. The AND gate group Q1 then provides, to the OR gate group Q2, erasure count data d1 representing this erasure count data ED in n bits. The AND gate group Q3 is composed of n 2-input AND gates and obtains a logical product of the same bit digits of the attribute effective bit data AS and the management data EAD. Accordingly, the AND gate group Q3 extracts the attribute data AT from the management data EAD. The AND gate group Q3 then provides, to the EXOR gate Q5, attribute data d2 representing this attribute data AT in n bits. The AND gate group Q4 is composed of n 2-input AND gates and obtains a logical product of the same bit digits of the attribute effective bit data AS and the specified attribute data DD. Accordingly, the AND gate group Q4 provides, to the EXOR gate Q5, specified attribute data d3 representing, in n bits, the specified attribute data including the bit group specified as effective by the attribute effective bit data AS in the specified attribute data DD. If the above-described attribute data d2 and specified attribute data d3 are the same, the EXOR gate Q5 provides, to the OR gate group Q2, a search exclusion signal d4 at a logic level 0 to cause the erasure count data d1 to be a search target. If the attribute data d2 and the specified attribute data d3 are different from each other, the EXOR gate Q5 provides, to the OR gate group Q2, the search exclusion signal d4 at the logic level 1 to cause the erasure count data d1 to be excluded from search targets. The OR gate group Q2 is composed of n 2-input OR gates corresponding to the bits of the n-bit erasure count data d1. The OR gate group Q2 obtains a logical sum of each bit in the erasure count data d1 and the search exclusion signal d4. Accordingly, if the search exclusion signal d4 is at the logic level 0, the OR gate group Q2 generates n-bit erasure count data Fn by using the erasure count data d1 as it is. If the search exclusion signal d4 is at the logic level 1, the OR gate group Q2 generates the erasure count data Fn in which all the bits are at the logic level 1 in order to exclude the erasure count data d1 from search targets. The OR gate group Q2 provides the erasure count data Fn to the comparator 641 and the selector 642.

With such a configuration, the search exclusion circuit 640 extracts the erasure count data ED from the management data EAD read from the SRAM 5. The search exclusion circuit 640 then outputs the erasure count data Fn representing this erasure count data ED in n bits. If the attribute data AT included in the management data EAD is different from the attribute data specified by the specified attribute data DD, the search exclusion circuit 640 outputs the erasure count data Fn in which all the bits are at the logic level 1, i.e., the erasure count data Fn representing a maximum erasure count expressible as the erasure count data Fn in order to exclude the block corresponding to this management data EAD from minimum erasure count search targets. With the use of the attribute effective bit data AS and the erasure count effective bit data ES, the search exclusion circuit 640 separates and extracts the attribute data AT and the erasure count data ED from the management data EAD. Therefore, even if the bit lengths of the attribute data AT and the erasure count data ED are changed on the basis of a specification of the installed flash memory 101, the attribute data AT and the erasure count data ED can be separated and extracted from the management data EAD.

The comparator 641 compares in size the erasure count data Fn with minimum erasure count data $F_{MIN}$ provided by the DFF 644. The comparator 641 then generates a comparison result signal CM1 representing the result of the comparison in size. The comparator 641 then provides the comparison result signal CM1 to the selectors 642 and 643. Specifically, when the erasure count data Fn is smaller than the minimum erasure count data $F_{MIN}$, the comparator 641 generates the comparison result signal CM1 having the logic level 1. When the erasure count data Fn is not smaller than the minimum erasure count data $F_{MIN}$, the comparator 641 generates the comparison result signal CM1 having the logic level 0. When the comparison result signal CM1 has the logic level 1, i.e., indicates that the erasure count data Fn is smaller than the minimum erasure count data $F_{MIN}$, the selector 642 selects the erasure count data Fn from among the above-described erasure count data Fn and minimum erasure count data $F_{MIN}$. The selector 642 then provides the erasure count data Fn to the DFF 644. On the other hand, when the comparison result signal CM1 has the logic level 0, i.e., indicates that the erasure count data Fn is not smaller than the minimum erasure count data $F_{MIN}$, the selector 642 selects the minimum erasure count data $F_{MIN}$ and provides this data to the DFF 644. The DFF 644 imports and stores the erasure count data Fn or the minimum erasure count data $F_{MIN}$ provided by the selector 642 in synchronization with the clock signal CLK. The DFF 644 then provides the stored erasure count data Fn or minimum erasure count data $F_{MIN}$ to the comparator 641 and the selector 642 as the smallest minimum erasure count data $F_{MIN}$ among the erasure count data searched for up to this point.

When the erasure count data Fn read from the SRAM 5 serving as a block management memory represents an erasure count smaller than the minimum erasure count data $F_{MIN}$, a first latch including the above-described comparator 641, selector 642, and DFF 644 imports and retains this erasure count data Fn. The first latch then outputs this erasure count data Fn as new minimum erasure count data $F_{MIN}$.

When the comparison result signal CM1 has the logic level 1, i.e., indicates that the erasure count data Fn is smaller than the minimum erasure count data $F_{MIN}$, the selector 643 selects the address indicated by the read address signal RDA from among the address indicated by the read address signal RDA provided by the read address generation circuit 61 and a minimum erasure count address $A_{MIN}$ provided by the DFF 645. The selector 643 then provides the selected address to the DFF 645. On the other hand, when the comparison result signal CM1 has the logic level 0, i.e., indicates that the erasure count data Fn is not smaller than the minimum erasure count data $F_{MIN}$, the selector 643 selects the minimum erasure count address $A_{MIN}$ and provides the selected address to the DFF 645. The DFF 645 imports and stores the address provided by the selector 643 in synchronization with the clock signal CLK. The DFF 645 then provides the stored address to the CPU 3 via the memory control bus 1 as the minimum erasure count address $A_{MIN}$ for the block corresponding to the smallest erasure count data among the erasure count data searched for up to this point.

When the erasure count data Fn read from the SRAM 5 serving as a block management memory represents an erasure count smaller than the minimum erasure count data $F_{MIN}$, a second latch including the above-described comparator 641, selector 643, and DFF 645 imports and retains the address indicated by the read address signal RDA and outputs the imported address as a new minimum erasure count address $A_{MIN}$.

With such a configuration, a minimum erasure count search circuit including the comparator 641, the selectors 642 and 643, and the DFFs 644 and 645 first receives the sequence of the erasure count data Fn corresponding to each of the blocks sent from the search exclusion circuit 640 and the read address signal RDA including the address sequences of the blocks at the same time. Every time the erasure count data Fn corresponding to each of the blocks is received, the minimum erasure count search circuit compares in size the erasure count data Fn with the minimum erasure count data $F_{MIN}$ searched for up to this point. The minimum erasure count search circuit then sets the smaller data as new minimum erasure count data $F_{MIN}$. The minimum erasure count search circuit executes such a series of processes on each of the erasure count data Fn corresponding to the addresses from the start address $A_{ST}$ to the end address $A_{ED}$ shown in FIG. 4. At this time, the minimum erasure count address $A_{MIN}$ obtained when the process on the erasure count data Fn corresponding to the end address $A_{ED}$ is completed is an address representing the block having the smallest erasure count among all the blocks having been search targets.

Figure 7:
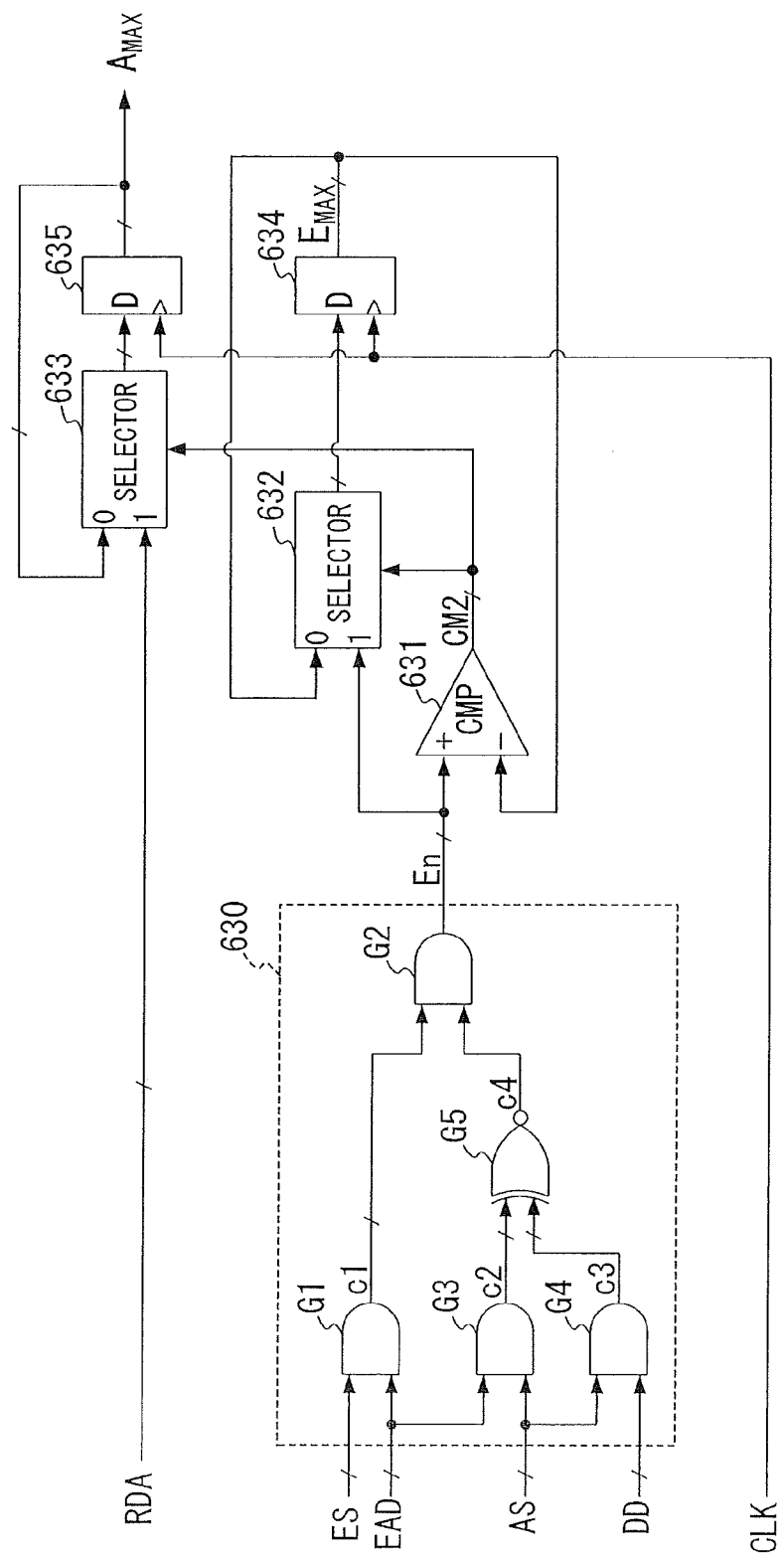
FIG. 7 is a circuit diagram illustrating an internal configuration of a maximum erasure count search part 63.

FIG. 7 is a circuit diagram illustrating an internal configuration of the maximum erasure count search part 63. As illustrated in FIG. 7, the maximum erasure count search part 63 includes a search exclusion circuit 630, a comparator 631, selectors 632 and 633, DFFs 634 and 635.

The search exclusion circuit 630 includes AND (logical product) gate groups G1 to G4 and an EXNOR (exclusive NOR) gate G5. The AND gate group G1 is composed of n 2-input AND gates having the same number as the bit length of the n-bit erasure count effective bit data ES. The AND gate group G1 obtains a logical product of the same bit digits of the erasure count effective bit data ES and the management data EAD. Accordingly, the AND gate group G1 extracts the erasure count data ED from the management data EAD. The AND gate group G1 then provides, to the AND gate group G2, erasure count data c1 representing the erasure count data ED in n bits. The AND gate group G3 is composed of n 2-input AND gates and obtains a logical product of the same bit digits of the attribute effective bit data AS and the management data EAD. Accordingly, the AND gate group G3 extracts the attribute data AT from the management data EAD. The AND gate group G3 then provides, to the EXNOR gate G5, attribute data c2 representing this attribute data AT in n bits. The AND gate group G4 is composed of n 2-input AND gates and obtains a logical product of the same bit digits of the attribute effective bit data AS and the specified attribute data DD. Accordingly, the AND gate group G4 provides, to the EXNOR gate G5, specified attribute data c3 representing, in n bits, the specified attribute data including the bit group specified as effective by the attribute effective bit data AS in the specified attribute data DD. If the above-described attribute data c2 and specified attribute data c3 are the same, the EXNOR gate G5 provides, to the AND gate group G2, a search exclusion signal c4 at the logic level 1 to cause the erasure count data c1 to be a search target. If the attribute data c2 and the specified attribute data c3 are different from each other, the EXNOR gate G5 provides, to the AND gate group G2, the search exclusion signal c4 at the logic level 0 to cause the erasure count data c1 to be excluded from search targets. The AND gate group G2 is composed of n 2-input AND gates corresponding to the bits of the n-bit erasure count data c1. The AND gate group G2 obtains a logical product of each bit in the erasure count data c1 and the search exclusion signal c4. Accordingly, if the search exclusion signal c4 is at the logic level 1, the AND gate group G2 generates n-bit erasure count data En by using the erasure count data c1 as it is. If the search exclusion signal c4 is at the logic level 0, the AND gate group G2 generates the erasure count data En in which all the bits are at the logic level 0 in order to exclude the erasure count data c1 from search targets. The AND gate group G2 provides such erasure count data En to the comparator 631 and the selector 632.

With such a configuration, the search exclusion circuit 630 extracts the erasure count data ED from the management data EAD read from the SRAM 5. The search exclusion circuit 630 then outputs the erasure count data En representing the erasure count data ED in n bits. If the attribute data AT included in the management data EAD is different from the attribute data specified by the specified attribute data DD, the search exclusion circuit 630 outputs the erasure count data En in which all the bits are at the logic level 0, i.e., the erasure count data En representing a minimum erasure count expressible as the erasure count data En in order to exclude the block corresponding to the management data EAD from maximum erasure count search targets. With the use of the attribute effective bit data AS and the erasure count effective bit data ES, the search exclusion circuit 630 separates and extracts the attribute data AT and the erasure count data ED from the management data EAD. Therefore, even if the bit lengths of the attribute data AT and the erasure count data ED are changed on the basis of a specification of the installed flash memory 101, the attribute data AT and the erasure count data ED can be separated and extracted from the management data EAD.

The comparator 631 compares in size such erasure count data En with maximum erasure count data $E_{MAX}$ provided by the DFF 634. The comparator 631 then generates a comparison result signal CM2 representing the result of the comparison in size. The comparator 631 then provides the comparison result signal CM2 to the selectors 632 and 633. Specifically, when the erasure count data En is larger than the maximum erasure count data $E_{MAX}$, the comparator 631 generates the comparison result signal CM2 having the logic level 1. When the erasure count data En is not larger than the maximum erasure count data $E_{MAX}$, on the other hand, the comparator 631 generates the comparison result signal CM2 having the logic level 0. When the comparison result signal CM2 has the logic level 1, i.e., indicates that the erasure count data En is larger than the maximum erasure count data $E_{MAX}$, the selector 632 selects the erasure count data En from among the above-described erasure count data En and maximum erasure count data $E_{MAX}$. The selector 632 then provides the erasure count data En to the DFF 634. When the comparison result signal CM2 has the logic level 0, i.e., indicates that the erasure count data En is not larger than the maximum erasure count data $E_{MAX}$, the selector 632 selects the maximum erasure count data $E_{MAX}$ and provides the maximum erasure count data $E_{MAX}$ to the DFF 634. The DFF 634 imports and stores the erasure count data En or the maximum erasure count data $E_{MAX}$ provided by the selector 632 in synchronization with the clock signal CLK. The DFF 634 then provides the imported data to the comparator 631 and the selector 632 as the largest maximum erasure count data $E_{MAX}$ among the erasure count data searched for up to this point.

When the erasure count data En read from the SRAM 5 serving as a block management memory represents an erasure count larger than the maximum erasure count data $E_{MAX}$, a third latch including the above-described comparator 631, selector 632, and DFF 634 imports and retains this erasure count data En. The third latch then outputs the erasure count data En as new maximum erasure count data $E_{MAX}$.

When the comparison result signal CM2 has the logic level 1, i.e., indicates that the erasure count data En is larger than the maximum erasure count data $E_{MAX}$, the selector 633 selects the address indicated by the read address signal RDA from among the above-described address indicated by the read address signal RDA and a maximum erasure count address $A_{MAX}$ provided by the DFF 635. The selector 633 then provides the selected address to the DFF 635. When the comparison result signal CM2 has the logic level 0, i.e., indicates that the erasure count data En is not larger than the maximum erasure count data $E_{MAX}$, the selector 633 selects the maximum erasure count address $A_{MAX}$ and provides the maximum erasure count address $A_{MAX}$ to the DFF 635. The DFF 635 imports and stores the address provided by the selector 633 in synchronization with the clock signal CLK. The DFF 635 then sends the stored address to the CPU 3 via the memory control bus 1 as the maximum erasure count address $A_{MAX}$ for the block corresponding to the largest erasure count data among the erasure count data searched for up to this point.

When the erasure count data En read from the SRAM 5 serving as a block management memory represents an erasure count larger than the maximum erasure count data $E_{MAX}$, a fourth latch including the above-described comparator 631, selector 633, and DFF 635 imports and retains the address indicated by the read address signal RDA and outputs the imported address as a new maximum erasure count address $A_{MAX}$.

With such a configuration, a maximum erasure count search circuit including the comparator 631, the selectors 632, 633, and the DFFs 634, 635 first receives the sequence of the erasure count data En corresponding to each of the blocks sent from the search exclusion circuit 630 and the read address signal RDA including the address data sequences of the blocks at the same time. At this time, every time the erasure count data En corresponding to one block is received, the maximum erasure count search circuit compares in size the erasure count data En with the maximum erasure count data $E_{MAX}$ searched for up to this point. The maximum erasure count search circuit then sets the larger data as new maximum erasure count data $E_{MAX}$. The maximum erasure count search circuit executes such a series of processes on each of the erasure count data En corresponding to the addresses from the start address $A_{ST}$ to the end address $A_{ED}$ shown in FIG. 4. At this time, the maximum erasure count address $A_{MAX}$ obtained when the process on the erasure count data En corresponding to the end address $A_{ED}$ is completed is an address representing the block having the largest erasure count among all the blocks having been search targets.

In the example illustrated in FIG. 3, the bit lengths of the management data EAD, the attribute data AT, and the erasure count data ED are 32 bits, 12 bits, and 20 bits, respectively. However, the bit lengths of these data are not limited to the above-described bit lengths.

In the above-described embodiment, both of the maximum erasure count search part 63 and the minimum erasure count search part 64 are operated. However, only the maximum erasure count search part 63 or only one of them may be operated as necessary.

In the above-described embodiment, the comparator 641 of the minimum erasure count search part 64 generates the comparison result signal CM1 at the logic level 1 when the erasure count data Fn is smaller than the minimum erasure count data $F_{MIN}$ and the comparison result signal CM1 at the logic level 0 when the erasure count data Fn is not smaller than the minimum erasure count data $F_{MIN}$. However, the output levels of the comparison result signal CM1 are not limited thereto. In short, the comparator 641 may be any comparator as long as the comparator generates a comparison result signal CM1 having a first level when the erasure count data Fn is smaller than the minimum erasure count data $F_{MIN}$ and generates a comparison result signal CM1 having a second level different from the first level when the erasure count data Fn not smaller than the minimum erasure count data $F_{MIN}$. The comparator 631 of the maximum erasure count search part 63 generates the comparison result signal CM2 at the logic level 1 when the erasure count data En is larger than the maximum erasure count data $E_{MAX}$ and the comparison result signal CM2 at the logic level 0 when the erasure count data En is not larger than the maximum erasure count data $E_{MAX}$. However, the output levels of the comparison result signal CM2 are not limited thereto. In short, the comparator 631 may be any comparator as long as the comparator generates a comparison result signal CM2 having a first level when the erasure count data En is larger than the maximum erasure count data $E_{MAX}$ and a comparison result signal CM2 having a second level different from the first level when the erasure count data En is not larger than the maximum erasure count data $E_{MAX}$.

As described above, the semiconductor device 100 of the embodiment according to the present invention searches for the address ($A_{MIN}$) of a block corresponding to the erasure count data piece ($F_{MIN}$) representing a minimum erasure count as follows from the block management memory (5) in which the erasure count data pieces (ED) each representing a cumulative erasure count are stored corresponding to the blocks each serving as a data erasure unit of the semiconductor memory (101). First, the read address generation circuit (61) generates the read address signal (RDA) including the address sequences of the blocks in response to a search start instruction. The read address generation circuit (61) then provides the read address signal to the block management memory to read the sequence of the erasure count data piece (Fn) from the block management memory. Here, when the erasure count data piece read from the block management memory represents an erasure count smaller than the minimum erasure count data piece ($F_{MIN}$), the first latch (641, 642, and 644) imports and retains the erasure count data piece to set this data piece as a new minimum erasure count data piece. When the erasure count data piece read from the block management memory represents an erasure count smaller than the minimum erasure count data piece, the second latch (641, 643 and 645) imports and retains the above-described read address signal and then outputs the address indicated by the read address signal as the minimum erasure count address ($A_{MIN}$).

Such a configuration makes it possible to search for the block corresponding to the erasure count data piece representing a minimum erasure count from among the sequences of the erasure count data pieces for the blocks read from the block management memory successively in a burst manner without an intervention of an instruction fetch cycle. Moreover, since the erasure count search is performed within the erasure count search circuit, a processing time taken from the issuance of the search start instruction by the CPU to the transmission of the search result to the CPU is shortened. Thus, the search can be performed at a high speed. Even when a plurality of search start instructions are successively issued from the CPU, the search results can be sequentially provided to the CPU. This reduces the processing time taken to the response without placing a load on the device, thereby achieving a high-speed search.

Thus, according to the semiconductor device of the embodiment according to the present invention, a block with a minimum erasure count can be searched for at a high speed from among blocks each serving as a data erasure unit in a non-volatile semiconductor memory such as a NAND type flash memory.

Moreover, according to the semiconductor device 100, even when the maximum erasure count search part 63 for searching for a block with a maximum erasure count is provided together with the minimum erasure count search part 64 as illustrated in FIG. 5, the search circuits (63 and 64) can be operated simultaneously. Therefore, the address ($A_{MAX}$) representing a block with a maximum erasure count and the address ($A_{MIN}$) representing a block with a minimum erasure count can be obtained simultaneously. Thus, immediately after that, the CPU can transition to execution of the data exchanging control to exchange the data stored in the block with the maximum erasure count and the data stored in the block with the minimum erasure count with each other.

Within the minimum erasure count search part 64 and the maximum erasure count search part 63, the search exclusion circuits (640 and 630) are provided to exclude, from search targets, those with other than attribute contents specified by the specified attribute data DD among all the blocks. This makes it possible to exclude erasure-protected blocks, destroyed blocks, and the like, for example, from search targets from the beginning. Therefore, redoing of the search process caused when such a substantially-inerasable block has been obtained as the maximum or minimum block can be prevented.

In the above-described embodiment, a block with a maximum erasure count and a block with a minimum erasure count are searched for in the maximum erasure count search part 63 and the minimum erasure count search part 64. However, a block having an erasure count larger than a predetermined number and a block having an erasure count smaller than the predetermined number may be searched for without being limited to the maximum and minimum erasure counts. Specifically, a configuration such that a block with the second smallest (or largest) erasure count or a block with the third smallest (or largest) erasure count, for example, is searched for may be possible.

In the above-described embodiment, in response to a data write instruction provided by the host device 200, the CPU 3 provides the search start data ST to start a search operation to the erasure count search circuit 6. However, the search start data ST may be provided to the erasure count search circuit 6 periodically. Alternatively, in response to an instruction other than a write instruction, the search start data ST may be provided to the erasure count search circuit 6.

In the above-described embodiment, with respect to the attribute data AT as shown in FIG. 3, the attribute effective bit data AS has the logic level 1 to enable all of the bit digits corresponding to this attribute data AT. However, the bit length enabled by the attribute effective bit data AS may be shorter than the bit length of the attribute data AT. Also, the bit digits to be enabled may not be continuous. Similarly, with respect to the erasure count data ED, the bit length enabled by the erasure count effective bit data ES may be shorter than the bit length of the erasure count data ED. Also, the bit digits to be enabled may not be continuous.

In the above-described embodiment, the address $A_{MIN}$ of the minimum erasure count block is outputted by the erasure count search circuit as a search result for the search start data provided by the CPU. The address $A_{MIN}$ may be transmitted to the CPU as soon as the search result is obtained. Alternatively, the address $A_{MIN}$ may be transmitted in response to an instruction for collecting the search result issued by the CPU.

In the above-described embodiment, from among the erasure count data pieces read from the block management memory, the erasure count search circuit 6 searches for a block corresponding to an erasure count data piece representing a minimum or maximum erasure count. However, the erasure counts to be search targets are not limited thereto. Specifically, the erasure count search circuit may search for an erasure count data piece representing a intended erasure count specified in advance from among the erasure count data pieces successively read from the block management memory as described above. The erasure count search circuit may then provide the address of the block corresponding to this erasure count data piece to the CPU. Therefore, the semiconductor device according to the present invention may be any semiconductor device as long as the device includes: a block management memory that stores, corresponding to each of blocks, an erasure count data piece representing a data erasure count performed in the block; a read address generation circuit that generates a read address signal in response to a search start instruction and provides the read address signal to the block management memory to successively read the erasure count data pieces from the block management memory; and an erasure count search circuit that searches for a block corresponding to an erasure count data piece representing a intended erasure count from among the erasure count data pieces read from the block management memory and transmits the search result.

This application is based on a Japanese Patent application No. 2013-205003 which is hereby incorporated by reference.

What is claimed is:

1. A semiconductor device comprising:
   a semiconductor memory in which data erasure is performed in units of blocks;
   a block management memory that stores, corresponding to each of the blocks, an erasure count data piece representing a data erasure count performed in the block;
   a read address generation circuit that generates a read address signal in response to a search start instruction and provides the read address signal to the block management memory to successively read the erasure count data pieces from the block management memory; and
   a minimum erasure count search circuit that searches for a block corresponding to an erasure count data piece representing a minimum erasure count from among the erasure count data pieces read from the block management memory,
   the minimum erasure count search circuit including:
   a first latch that outputs, when the erasure count data piece read from the block management memory represents an erasure count smaller than a minimum erasure count data piece, the erasure count data piece as the minimum erasure count data piece; and
   a second latch that outputs, when the erasure count data piece read from the block management memory represents an erasure count smaller than the minimum erasure count data piece, an address indicated by the read address signal as a minimum erasure count address.

2. The semiconductor device according to claim 1, wherein corresponding to each of the blocks, an attribute data piece representing an attribute of the block is stored in the block management memory together with the erasure count data piece, and
   the semiconductor device further comprises a first search exclusion circuit that excludes the attribute data piece from search targets on the basis of comparison between the attribute data piece and a specified attribute data piece.

3. The semiconductor device according to claim 1, wherein corresponding to each of the blocks, an attribute data piece representing an attribute of the block is stored in the block management memory together with the erasure count data piece, and
   the semiconductor device further comprises a first search exclusion circuit that provides, to the minimum erasure count search circuit, when the attribute data piece does not coincide with a specified attribute data piece, an erasure count obtained by changing an erasure count represented by the erasure count data piece corresponding to the attribute data piece to a maximum erasure count expressible by the erasure count data piece.

4. The semiconductor device according to claim 1, comprising a maximum erasure count search circuit that searches for a block corresponding to an erasure count data piece representing a maximum erasure count from among the erasure count data pieces read from the block management memory, wherein the maximum erasure count search circuit includes:
   a third latch that outputs, when the erasure count data piece read from the block management memory represents an erasure count larger than a maximum erasure count data piece, the erasure count data piece as the maximum erasure count data piece; and
   a fourth latch that outputs, when the erasure count data piece read from the block management memory represents an erasure count larger than the maximum erasure count data piece, an address indicated by the read address signal as a maximum erasure count address.

5. The semiconductor device according to claim 4, wherein corresponding to each of the blocks, an attribute data piece representing an attribute of the block is stored in the block management memory together with the erasure count data piece, and the semiconductor device further comprises a second search exclusion circuit that excludes the attribute data piece from search targets based on a comparison between the attribute data piece and a specified attribute data.

6. The semiconductor device according to claim 4, wherein corresponding to each of the blocks, an attribute data piece representing an attribute of the block is stored in the block management memory together with the erasure count data piece, and the semiconductor device further comprises a second search exclusion circuit that provides, to the maximum erasure count search circuit, when the attribute data piece does not coincide with a specified attribute data piece, an erasure count obtained by changing an erasure count represented by the erasure count data piece corresponding to the attribute data piece to a minimum erasure count expressible by the erasure count data piece.

7. The semiconductor device according to claim 2, wherein the attribute data piece includes:
used information indicating whether or not data has been written into its corresponding block;
destruction information indicating whether or not the block has been destroyed, and/or
protected information indicating whether or not inerasable protected data has been stored in the block.

8. The semiconductor device according to claim 1, comprising a CPU that provides the search start instruction to the read address generation circuit in response to a data write instruction or periodically, and wherein
the CPU selects a block corresponding to the minimum erasure count address outputted from the second latch as a block to be a data write destination and controls the semiconductor memory in order to write data into the selected block.

9. The semiconductor device according to claim 4, comprising a CPU that provides the search start instruction to the read address generation circuit in response to a data write instruction or periodically, and wherein
the CPU controls the semiconductor memory in order to exchange data written into a block corresponding to the minimum erasure count address outputted from the second latch and data written into a block corresponding to the maximum erasure count address outputted from the fourth latch with each other.

10. A method of searching for an erasure count in a semiconductor memory in which data erasure is performed in units of blocks, the method comprising:

a step that stores, corresponding to each of the blocks, an erasure count data piece representing a data erasure count performed in the block in a block management memory;

a step that generates a read address signal in response to a search start instruction and provides the read address signal to the block management memory to successively read the erasure count data pieces from the block management memory; and a minimum erasure count search step that searches a block corresponding to an erasure count data piece representing a minimum erasure count from among the erasure count data pieces read from the block management memory, wherein, when the erasure count data piece read from the block management memory represents an erasure count smaller than a minimum erasure count data piece, the erasure count data piece is outputted as the minimum erasure count data piece and an address indicated by the read address signal is outputted as a minimum erasure count address.

11. A semiconductor device comprising:
a semiconductor memory in which data erasure is performed in units of blocks;
a block management memory that stores, corresponding to each of the blocks, an erasure count data piece representing a data erasure count performed in the block;
a read address generation circuit that generates a read address signal in response to a search start instruction and provides the read address signal to the block management memory to successively read the erasure count data pieces from the block management memory; and
an erasure count search circuit that searches for a block corresponding to an erasure count data piece representing a intended erasure count from among the erasure count data pieces read from the block management memory and transmits a result of the search,
wherein the search result is an erasure count address of the block corresponding to the erasure count data piece representing the intended erasure count among the erasure count data pieces.

12. The semiconductor device according to claim 11, comprising a CPU that outputs the search start instruction and receives the search result transmitted from the erasure count search circuit.

* * * * *